United States Patent
Chen et al.

(10) Patent No.: US 7,075,375 B2
(45) Date of Patent: Jul. 11, 2006

(54) PHASE LOCKED LOOP FOR CONTROLLING AN OPTICAL RECORDING DEVICE AND METHOD THEREOF

(75) Inventors: Hong-Ching Chen, Kao-Hsiung Hsien (TW); Chi-Ming Chang, Tao-Yuan Hsien (TW)

(73) Assignee: Mediatek Incorporation, Hsin-Chu Hsien (TW)

( * ) Notice: Subject to any disclaimer, the term of this patent is extended or adjusted under 35 U.S.C. 154(b) by 60 days.

(21) Appl. No.: 10/710,934

(22) Filed: Aug. 13, 2004

(65) Prior Publication Data

US 2006/0033580 A1 Feb. 16, 2006

(51) Int. Cl.
*H03L 7/87* (2006.01)
*G11B 5/09* (2006.01)

(52) U.S. Cl. .............. 331/11; 331/16; 331/18; 360/51

(58) Field of Classification Search .......... 331/1 A, 331/10, 11, 16, 18, 25; 327/156–159; 332/127; 360/51; 375/376; 455/260
See application file for complete search history.

(56) References Cited

U.S. PATENT DOCUMENTS

| 6,710,951 | B1 | 3/2004 | Cloke |
| 2001/0055249 | A1 | 12/2001 | Moriwakl |
| 2002/0105389 | A1 | 8/2002 | Nishimura et al. |
| 2003/0067356 | A1* | 4/2003 | Bokui et al. ............ 331/11 |
| 2004/0095861 | A1* | 5/2004 | Hsu et al. ............ 369/47.28 |

FOREIGN PATENT DOCUMENTS

EP 0076981 * 4/1983

* cited by examiner

*Primary Examiner*—David Mis
(74) *Attorney, Agent, or Firm*—Winston Hsu

(57) ABSTRACT

A PLL system for generating an output signal according to a first reference signal is disclosed. The output signal is used as a reference clock to write recording data on an optical medium. The PLL system includes a clock generator for receiving the first reference signal and a first frequency-divided signal to generate the output signal according to a phase difference between the first reference signal and the first frequency-divided signal; a phase-shift detector for generating a phase adjusting signal; and a phase-controllable frequency divider for dividing the frequency of the output signal by a frequency dividing ratio to generate the first frequency-divided signal and for receiving the phase adjusting signal to adjust the phase of the first frequency-divided signal.

32 Claims, 18 Drawing Sheets

PHASE LOCKED LOOP FOR CONTROLLING AN OPTICAL RECORDING DEVICE AND METHOD THEREOF

BACKGROUND

The invention relates to a phase locked loop for controlling an optical recording device, and more particularly, to a phase locked loop having a phase-shift detector and a phase-controllable frequency divider for controlling an optical recording device.

In a conventional recordable optical disk, such as a DVD-R/RW disk or a DVD+R/RW disk, a wobble signal is used as a reference to generate a write clock for recording data on an optical disk. A phase locked loop (PLL) is commonly applied for generating the required write clock with reference to the wobble signal. Please refer to FIG. 1, which is a diagram of a related art PLL 10. As shown in FIG. 1, the related art PLL 10 generates an output clock in response to a wobble signal extracted from the wobble tracks on a recordable optical disk. The output clock is used to be the reference for the recording bit clock. The PLL 10 includes a phase detector (PD) 20, a charge pump 30, a loop filter 40, a voltage-controlled oscillator (VCO) 50, and a frequency divider 60. The PD 20 is used to output a phase error signal to the charge pump 30 by detecting the phase difference between the wobble signal and a divided signal generated from the frequency divider 60. The charge pump 30 is used to generate a voltage based on the phase error signal from the PD 20. After the loop filter 40 receives the voltage outputted from the charge pump 30, the loop filter 40 outputs a control voltage to control the following VCO 50. The VCO 50 receives the control voltage outputted from the loop filter 40, and generates the output clock according to the control voltage. Generally, the frequency of the output clock signal is higher than that of the wobble signal, so that the frequency divider 60 is required for dividing the frequency of the output clock outputted from the VCO 50 to generate the frequency-divided signal delivered to the PD 20.

However, the related art PLL 10 sometimes cannot make the phase of the output clock in synchronization with the phase of the wobble signal due to the limitation of the PD 20, which is called the phase shift phenomenon. Please refer to FIG. 2, which illustrates the phase shift phenomenon of the related art. The horizontal axis represents the phase difference θe between the wobble signal and the frequency-divided signal inputted into the PD 20, and the vertical axis stands for the phase error $\mu_d$ outputted from the PD 20. In addition, the symbol $\Delta W_d$ is the detection range of the PD 20. As shown in FIG. 2, it can be easily seen that the phase difference θe is not necessarily equal to zero when the phase error $\mu_d$ equals zero. If the phase difference θe is within the detection range $\Delta W_d$ of PD 20, such as the point B shown in FIG. 2, the PLL 10 tracks and reduces the phase difference θe to zero (the point A shown in FIG. 2). However, if the phase difference θe is outside the detection range $\Delta W_d$ of the PD 20, such as the point C shown in FIG. 2, the outputted phase error $\mu_d$ makes the PLL 10 lock the phase to the nearest zero-crossing point (the point D shown in FIG. 2), rather than the desired one (the point A shown in FIG. 2). Therefore, the appearance of the phase shift phenomenon makes the PLL 10 malfunction.

In the application of recording data on an optical disk, if the phase shift phenomenon occurs, the length of recorded data, which is synchronous to the output clock of the PLL 10, is affected to be longer or shorter than a normal length. Please refer to FIG. 3, which illustrates the recording offset of the related art. The FIG. 3(a) shows the case that the length of recorded data is longer than a normal length, and the FIG. 3(b) shows another case that the length of recorded data is shorter than the normal length. Suppose that the normal length of each data block is L. As shown in FIG. 3, the length $W_1$ of the data block $DATA_1$ is longer than the normal length L. Therefore, a recording offset $D_1$ is introduced to the recording process, and affects the recording position of the following data blocks $DATA_2$ and $DATA_3$. Similarly, as shown in FIG. 3, the length $W_2$ of the data block $DATA_4$ is shorter than the normal length L, and a recording offset $D_2$ is generated. Therefore, the recording position of the following data blocks $DATA_5$ and $DATA_6$ are affected accordingly. The length variation of recorded data causes the position of recorded data shifted from the normal position specified by the recording specification. As mentioned above, each recording offset due to the phase shift phenomenon is accumulated, which is a serious problem of the recording.

SUMMARY OF INVENTION

It is therefore one of the primary objectives of the claimed invention to provide a PLL having a phase-shift detector and a phase-controllable frequency divider for generating a recording clock to solve the above-mentioned problem.

According to the embodiment of the claimed invention, a PLL system for generating an output signal according to a first reference signal is disclosed. The output signal is used as a reference clock to write recording data on an optical medium. The PLL system comprises a clock generator for receiving the first reference signal and a first frequency-divided signal to generate the output signal according to a phase difference between the first reference signal and the first frequency-divided signal; a phase-shift detector for generating a phase adjusting signal; and a phase-controllable frequency divider connected to the clock generator and the phase-shift detector for dividing the output signal to generate the first frequency-divided signal and receiving the phase adjusting signal to adjust the phase of the first frequency-divided signal.

In addition, according to the embodiment of the claimed invention, a method for generating an output signal according to a first reference signal is disclosed. The output signal is used as a reference clock to write recording data on an optical medium. The method comprises receiving the first reference signal and a first frequency-divided signal to generate the output signal according to a phase difference between the first reference signal and the first frequency-divided signal; generating a phase adjusting signal; and dividing the output signal to generate the first frequency-divided signal and receiving the phase adjusting signal to adjust the phase of the first frequency-divided signal.

It is an advantage of the claimed invention that the frequency divider positioned at the feedback path is phase-controllable. Therefore, the problem of related art phase shift phenomenon is solved through controlling the phase-controllable frequency divider, and the recording quality is greatly improved. Besides, no matter how large the phase shift is, the claimed invention is capable of making the phase of the output clock locked to the correct phase.

These and other objectives of the claimed invention will no doubt become obvious to those of ordinary skill in the art after reading the following description of the preferred embodiment that is illustrated in the various figures and drawings.

DETAILED DESCRIPTION

Figure 4:
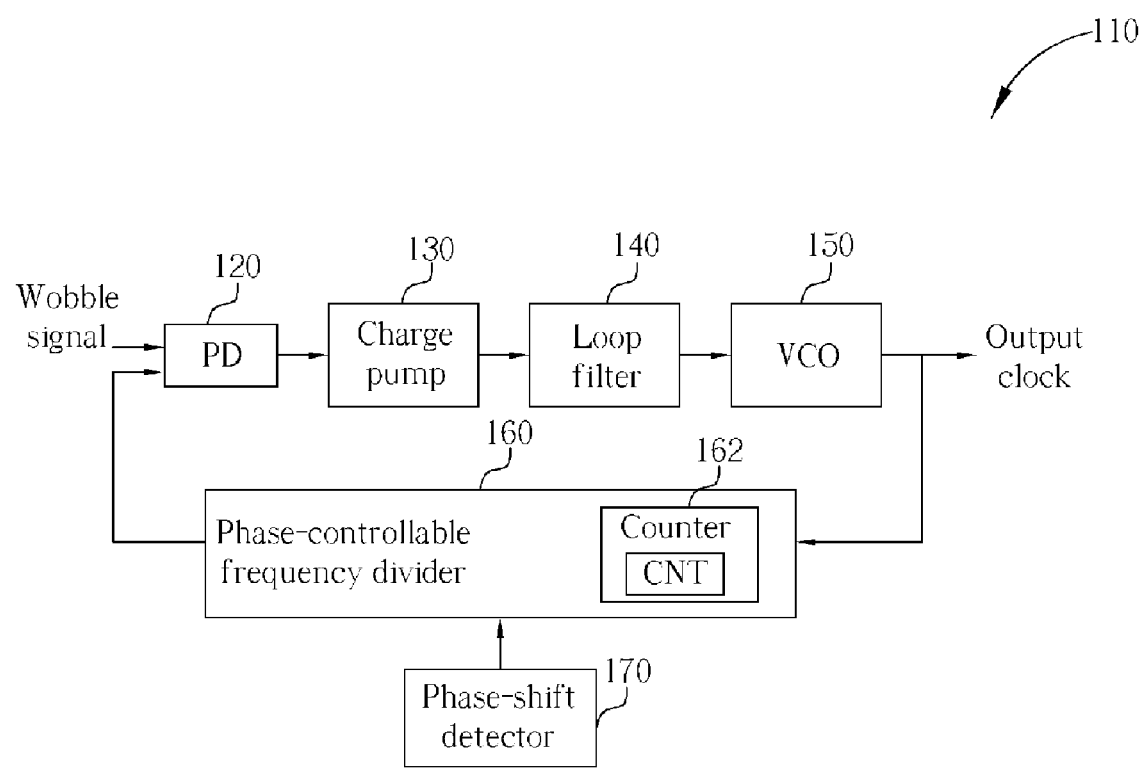
FIG. 4 is a block diagram of a phase locked loop (PLL) system according to the present invention.

Please refer to FIG. 4, which is a block diagram of a phase locked loop (PLL) system 110 according to the present invention. The PLL system 110 includes a phase-controllable frequency divider 160, a phase-shift detector 170, a phase detector (PD) 120, a charge pump 130, a loop filter 140, and a voltage-controlled oscillator (VCO) 150. The function of the PD 120, the charge pump 130, the loop filter 140, and the VCO 150 is the same as that of the those components of the same name in the related art PLL 10, and thus the lengthy description is omitted here for simplicity. The phase-shift detector 170 is used to detect the direction and the amount of the phase shift, and outputs a phase-adjusting signal to the phase-controllable frequency divider 160. The phase-controllable frequency divider 160 is capable of dividing the frequency of the output clock to generate a frequency-divided signal, and adjusting the phase of the frequency-divided signal according to the detection result outputted from the phase-shift detector 170. In this embodiment, the phase-controllable frequency divider 160 has a counter 162 for storing a count value CNT. This count value CNT determines the phase associated with the frequency-divided signal. The operations of the phase-shift detector 170 and the phase-controllable frequency divider 160 are further detailed as follows.

Figure 5:
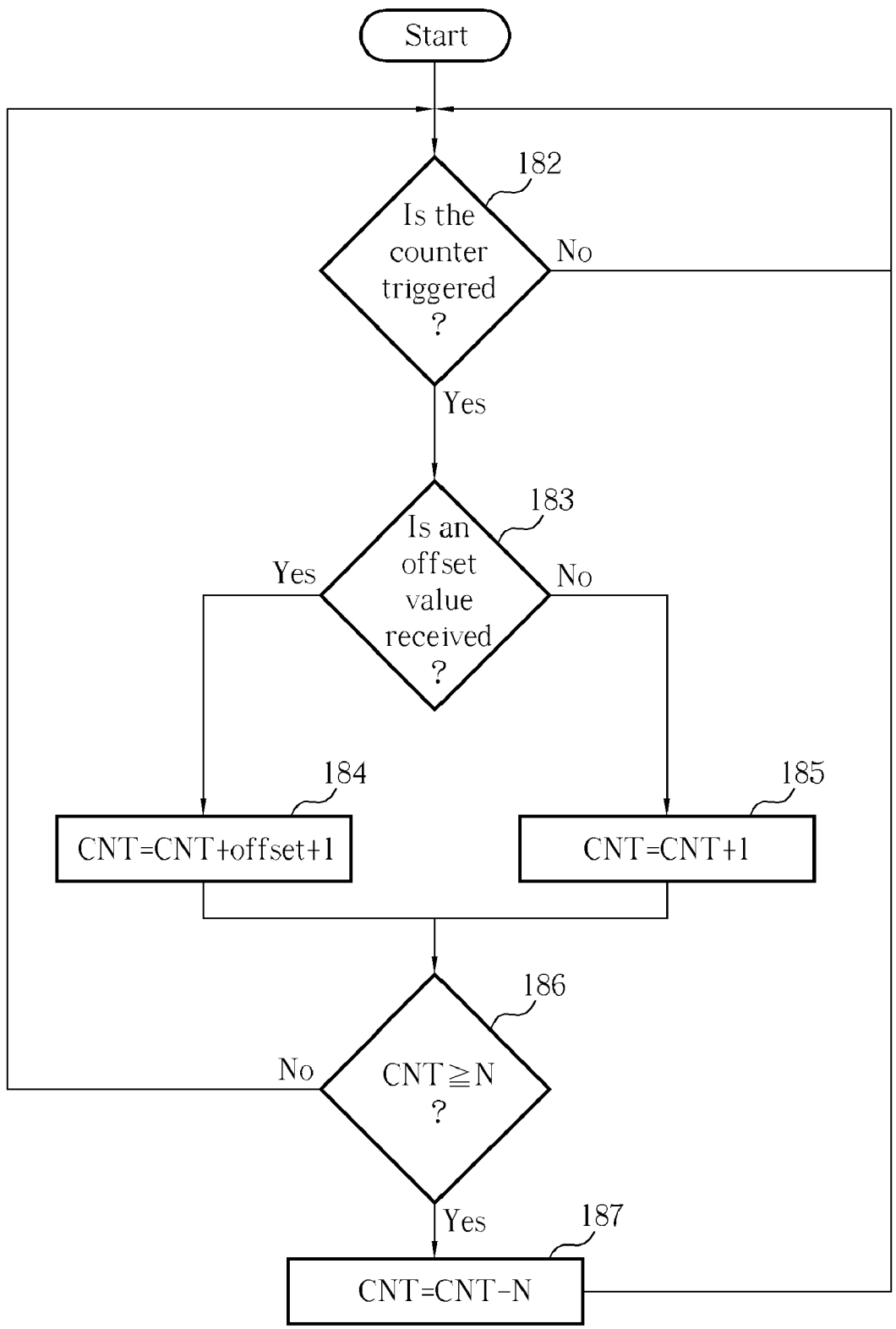
FIG. 5 is a flow chart illustrating the operation of tuning a count value utilized by a phase-controllable frequency divider shown in FIG. 4.

Please refer to FIG. 5 in conjunction with FIG. 4. FIG. 5 is a flow chart illustrating the operation of tuning the count value CNT utilized by the phase-controllable frequency divider 160 shown in FIG. 4. As mentioned above, the phase-controllable frequency divider 160 is connected to the VCO 150 for receiving the output clock. In this embodiment, the counter 162 within the phase-controllable frequency divider 160 is triggered by each cycle of the output clock, and then the phase-controllable frequency divider 160 controls the phase of the frequency-divided signal according to the count value CNT of the counter 162, in which the threshold value N is the dividing ratio of the phase-controllable frequency divider 160. In other words, if the frequency of the output clock is equal to F, the frequency of the frequency-divided signal equals (F÷N). As described before, the phase shift phenomenon in the related art affects the PLL system 110 to lock to the desired phase for the output clock. To solve the problem of phase shift phenomenon, the phase-shift detector 170 measures the actual phase shift deviated from the desired phase, and outputs the phase-adjusting signal to the phase-controllable frequency divider 160 according to the detected phase shift. In this embodiment, an offset value is transmitted to the phase-controllable frequency divider 160 through the phase-adjusting signal. The operation of setting the count value CNT is detailed as follows. When the counter 162 within the phase-controllable frequency divider 160 is triggered by a rising edge or a falling edge of a cycle of the output clock, the count value CNT is required being updated (step 182). Then, the existence of the offset value is checked (step 183). If the phase-shift detector 170 detects a phase shift affecting the output clock, the offset value is delivered to the phase-controllable frequency divider 160 and the count value CNT is updated by a new value equaling CNT+offset+1 (step 184). On the contrary, if the phase-shift detector 170 detects no phase shift affecting the output clock, the count value CNT is updated by a new value equaling CNT+1 (step 185). Then, if the newly updated count value CNT is equal to or larger than the threshold value N, the count value CNT is further updated by a new value equaling CNT−N (step 187).

Figure 6:
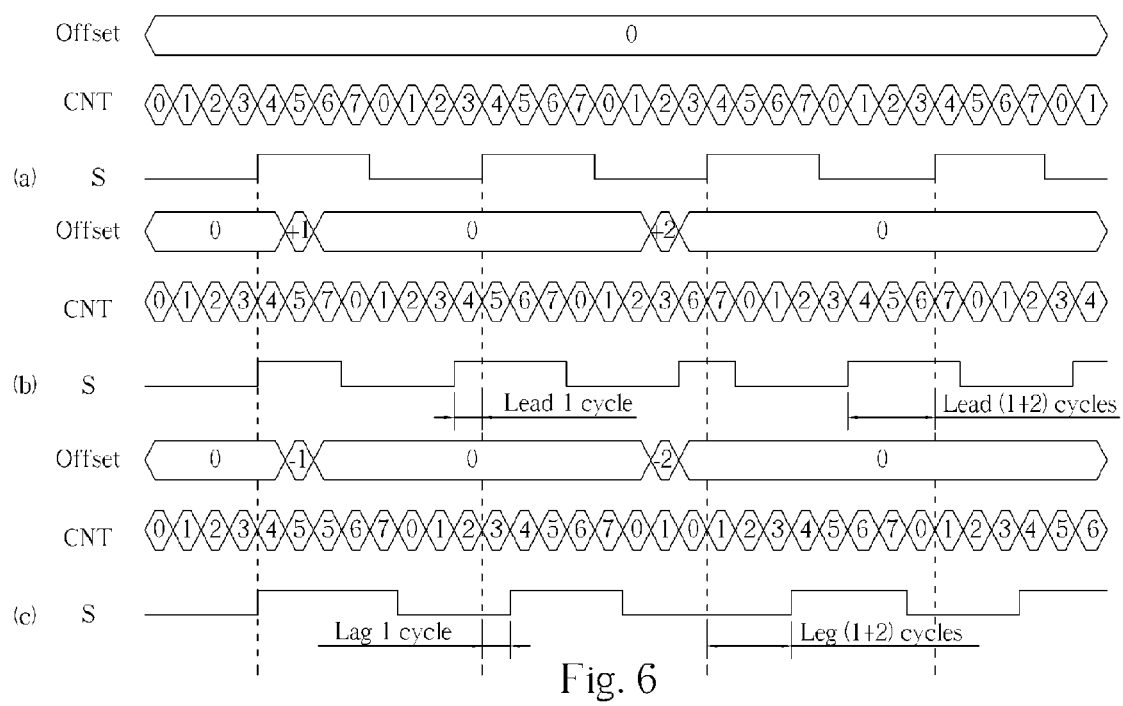
FIG. 6 is a timing diagram illustrating the operations of a phase-shift detector and the phase-controllable frequency divider shown in FIG. 4.

Please refer to FIG. 6 in conjunction with FIGS. 4 and 5. FIG. 6 is a timing diagram illustrating the operations of the phase-shift detector 170 and the phase-controllable frequency divider 160 shown in FIG. 4, in which the dividing ratio N is equal to 8 and the waveform of the frequency-divided signal is equal to the logic value of that the count value CNT≧4. As shown in FIG. 6(a), if the phase-shift detector 170 is disabled, the count value CNT is counted normally, and the rising edge of the frequency-divided signal S is aligned to when the count value CNT is equal to 4. However, when the phase-shift detector 170 is activated to detect the phase shift for generating the offset value, the count value CNT is tuned to adjust the phase of the frequency-divided signal S. As shown in FIG. 6(b), it is easily seen that the phase of the frequency-divided signal S is controlled to lead the phase of the frequency-divided signal S of FIG. 6(a) when the offset value is set to a positive value (e.g. +1 or +2). As shown in FIG. 6(c), the phase of the frequency-divided signal S is controlled to lag the phase of the frequency-divided signal of FIG. 6(a) when the offset value is set to a negative value (e.g. −1 or −2). As shown in FIGS. 5 and 6, when the phase-shift detector 170 does not transfer any phase-shift signal to the phase-controllable frequency divider 160, the offset value is 0 and the counter 162 sequentially counts the cycles of the output clock for generating the frequency-divided signal. But if the phase-shift detector 170 transfers the phase-shift signal to the phase-controllable frequency divider 160, the offset value is +1, +2, −1, or −2, and the count value CNT is changed according to the inputted offset value, so that the phase of the frequency-divided signal is therefore shifted according to the phase shift detected by the phase-shift detector 170.

In addition to the method shown in FIG. 5, it can also adjust the phase of the frequency-divided signal by temporarily altering the dividing ratio of the counter 162. The phase of the frequency-divided signal is changed if the dividing ratio of the counter 162 varies. In other words, one period of the frequency-divided signal outputted from the phase-controllable frequency divider 160 is increased or decreased according to the phase-adjusting signal from the phase-shift detector 170. For example, the counter 162 can be a counter that increases normally and is normalized to zero when the value of the counter is equal to the adjustable threshold value N, in which the threshold value N is adjusted according to the phase-adjusting signal from the phase-shift detector 170.

Figure 7:
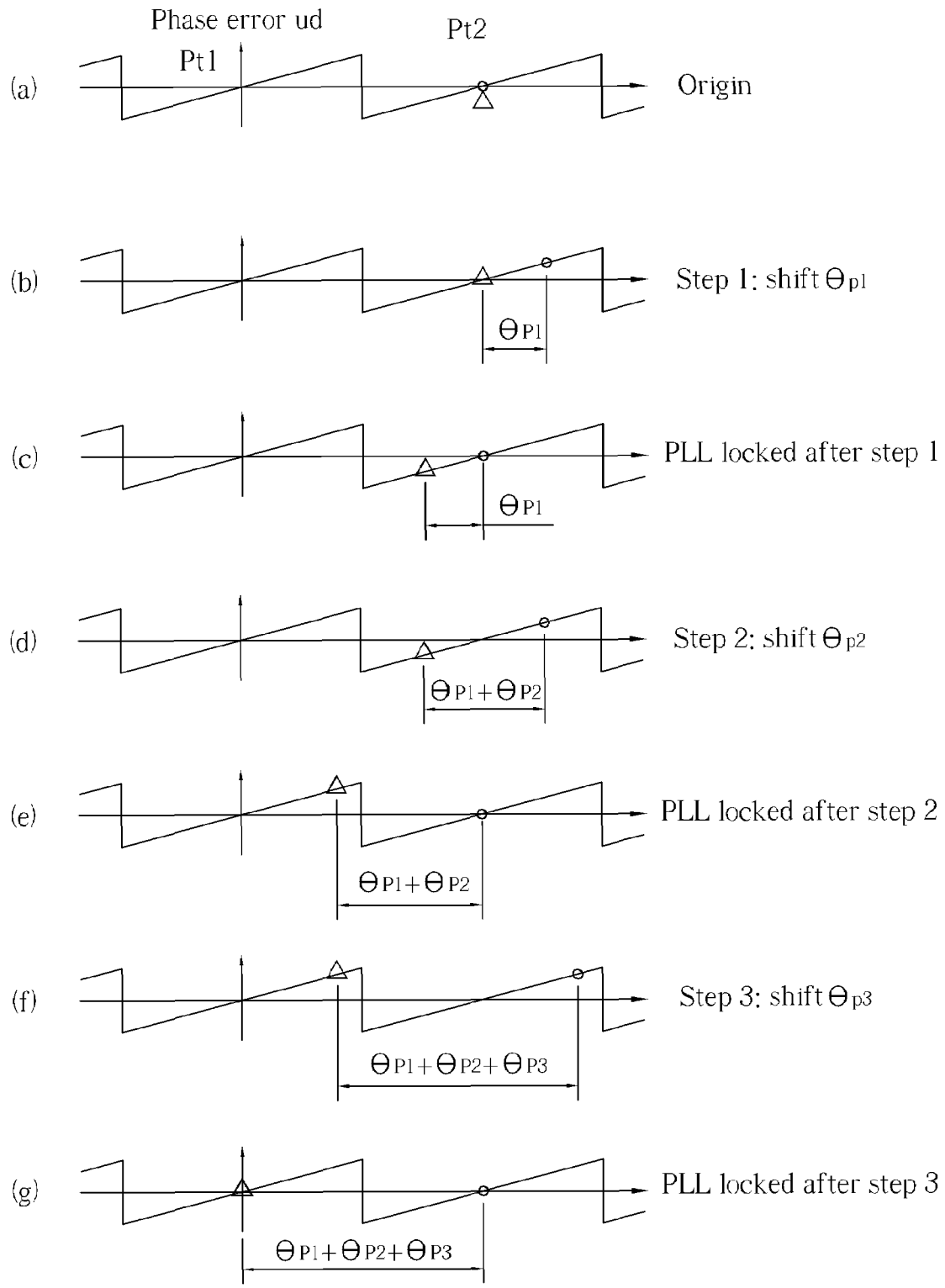
FIG. 7 is a diagram illustrating the operation of adjusting the phase of an output clock locked in a wrong point to the correct point according to the present invention.

Please refer to FIG. 7, which is a diagram illustrating the operation of adjusting the phase of the output clock locked in a wrong point to reach a correct point according to the present invention. The horizontal axis represents the phase difference between the wobble signal and the frequency-divided signal inputted into the PD 120, and the vertical axis stands for the phase error outputted from the PD 120. In FIG. 7, the circle symbol "○" is used to stand for the phase of the frequency-divided signal outputted from the phase-controllable frequency divider 160, and the triangle symbol "Δ" is used to stand for the phase of the output clock. As shown in FIG. 7(a), a situation is shown that the output clock is locked to an incorrect phase at the zero-crossing point pt2, rather than the correct phase at the zero-crossing point pt1. Initially, in FIG. 7(a), the phase of the frequency-divided signal is equal to the phase of the output clock, so that the circle symbol "○" and the triangle symbol "Δ" are placed at the same point pt2.

Firstly, as shown in FIG. 7(b), the phase-controllable frequency divider 160 adjusts the phase of the frequency-divided signal by a phase increment $\theta_{p1}$ to increase the phase difference between the wobble signal and the frequency-divided signal according to the phase-adjusting signal outputted from the phase-shift detector 170. After the phase of the frequency-divided signal is adjusted, the phase of the frequency-divided signal (the circle symbol "○") is moved with the distance of $\theta_{p1}$ away from the point pt2, while the phase of the output clock (the triangle symbol "Δ") is still at the point pt2. Then, as shown in FIG. 7(c), the PLL system 110 works to minimize the phase error signal of the phase detector (PD) 120. That is, the PLL system 110 lags the phase of the output clock (the triangle symbol "Δ") by the phase increment $\theta_{p2}$ to make the phase of the frequency-divided signal (the circle symbol "○") back into the nearest zero-crossing point, i.e. the point pt2. As a result, the overall phase shift of the output clock is reduced with a mount of $\theta_{p1}$. Secondly, as shown in FIG. 7(d), the phase-controllable frequency divider 160 further adjusts the phase of the frequency-divided signal by a phase increment $\theta_{p2}$ to increase the phase difference between the wobble signal and the frequency-divided signal according to the phase-adjusting signal outputted from the phase-shift detector 170. After the phase of the frequency-divided signal is adjusted, the phase of the frequency-divided signal is moved with the distance of $\theta_{p2}$ away from the point pt2, At this time, the accumulated phase adjust is equal to $\theta_{p1}+\theta_{p2}$, which is also the difference between the phase of the frequency-divided signal and the output clock. Then, as shown in FIG. 7(e), the PLL system 110 works again to minimize the phase error signal of the phase detector (PD) 120. That is, the PLL system 110 lags the phase of the output clock by the phase increment $\theta_{p2}$ to make the phase of the frequency-divided signal back into the point pt2. As a result, the overall phase shift of the output clock is further reduced with an additional mount of $\theta_{p2}$. Finally, as shown in FIG. 7(f), the phase-controllable frequency divider 160 further adjusts the phase of the frequency-divided signal by a phase increment $\theta_{p3}$ to increase the phase difference between the wobble signal and the frequency-divided signal according to the phase-adjusting signal outputted from the phase-shift detector 170. After the phase of the frequency-divided signal is adjusted, the phase of the frequency-divided signal is moved with the distance of $\theta_{p3}$ away from the point pt2, At this time, the accumulated phase adjust is equal to $\theta_{p1}+\theta_{p2}+\theta_{p3}$, which is also the difference between the phase of the frequency-divided signal and the output clock. Then, as shown in FIG. 7(g), the PLL system 110 works again to minimize the phase error signal of the phase detector (PD) 120. That is, the PLL system 110 lags the phase of the output clock by the phase increment $\theta_{p3}$ to make the phase of the frequency-divided signal back into the point pt2. As a result, the overall phase shift of the output clock is further reduced with an additional mount of $\theta_{p3}$. As mentioned above, the offset values computed by the phase-shift detector 170 are capable of gradually tuning the phase of the output clock to eliminate the related art phase shift phenomenon imposed upon the output clock.

When the phase adjusting operation responds to the output of VCO 150, the variation of output clock is very smooth due to the loop filter 140. Please note that the phase adjustments $\theta_{p1}$, $\theta_{p2}$, $\theta_{p3}$ are suggested not exceeding a half of the detection range $\Delta W_d$ to make the control of the phase adjusting as simple as possible. If one of the phase adjustments $\theta_p$ is greater than half of the detection range $\Delta W_d$, the PLL system 110 locks the phase of the output clock to another phase further deviated from the desired one, which means the control of the phase adjusting is complex. Besides, no matter how large the amount of unwanted phase shift is, the present invention is capable of adjusting the phase shift by a plurality of phase adjustments. As mentioned above, the phase adjustment $\theta_p$ can be smaller than half of the detection range $\Delta W_d$. For example, if the detection range $\Delta W_d$ is 8T and the initial amount of detected phase shift is 48T, the selected phase increment $\theta_p$ can be defined as 2T and it only needs 24 (48T/2T) times of phase adjustments to compensate the phase shift imposed upon the output clock. Moreover, it needs to keep the time between two adjacent phase adjustments long enough to make the PLL system 110 minimize the phase error caused by the phase adjustment.

Please note that the components of the same name among the PLL system 110 shown in FIG. 4 and the following embodiments have the same functionality and operation. Therefore, the lengthy description for the identical component in each alternative embodiment disclosed later is not repeated for simplicity.

Figure 8:
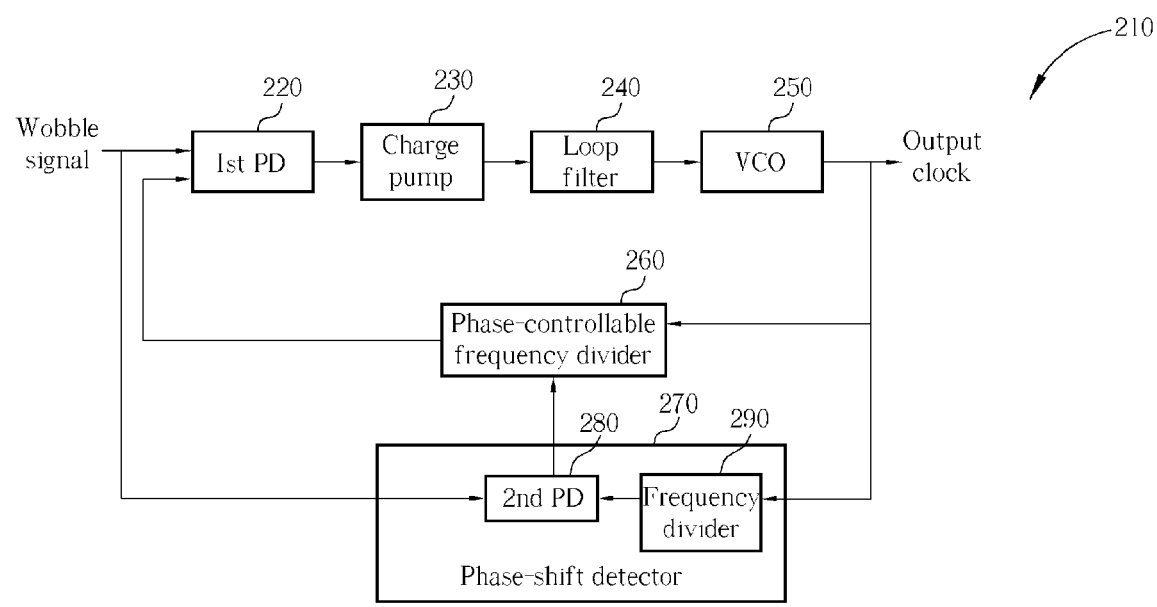
FIG. 8 is a block diagram of a PLL system according to a first embodiment of the present invention.

Please refer to FIG. 8, which is a block diagram of a PLL system 210 according to a first embodiment of the present invention. The PLL system 210 comprises a first PD 220, a charge pump 230, a loop filter 240, a VCO 250, a phase-controllable frequency divider 260, and a phase-shift detector 270. In this embodiment, the phase-shift detector comprises a second PD 280 and a frequency divider 290. The frequency divider 290 divides the frequency of the output clock, and sends the divided clock into the second PD 280.

Therefore, as shown in FIG. 8, the second PD 280 is capable of detecting the phase difference between the divided clock of the frequency divider 290 and the wobble signal to estimate the phase shift imposed upon the output clock. Please note that the phase-controllable frequency divider 260 divides the frequency of the output clock by N, but the frequency divider 290 is used to divide the frequency of the output clock by K, where K>N, to make the detection range of the second PD 280 larger than the one of the first PD 220. For example, assume that k is set to 32, and N is set to 8. Concerning the DVD+R/RW application that the period of the wobble signal is 32T, if the phase shift is larger than 4T but lower than 16T, the first PD 220 is unable to detect the phase shift, but the second PD 280 can detect this phase shift. Therefore, the phase shift detector 270 of this embodiment is capable of generating the phase-adjusting signals to the phase-controllable frequency divider 260 according to the detected phase shift.

Figure 9:
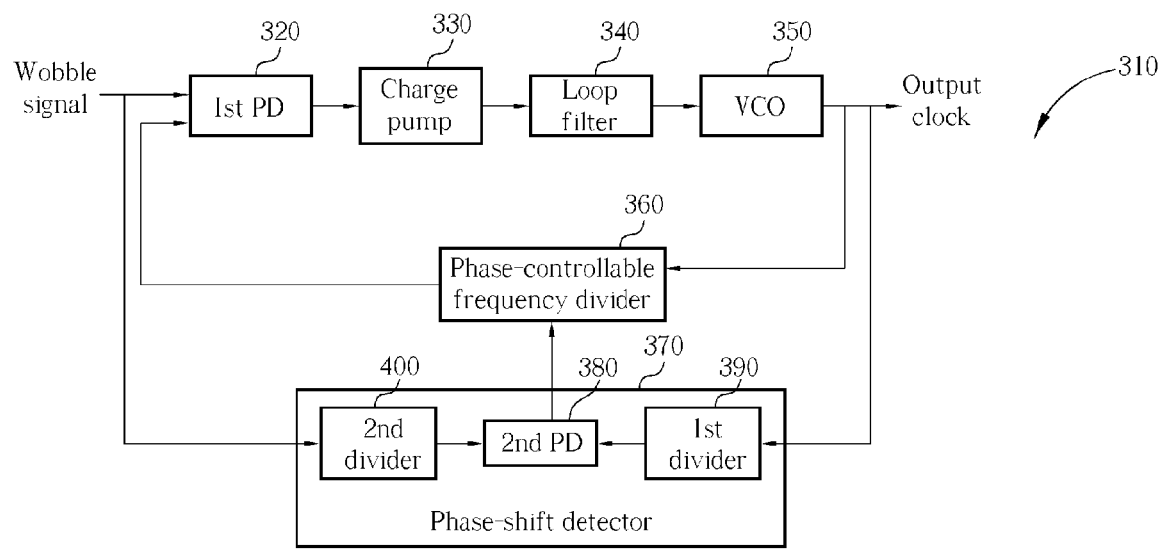
FIG. 9 is a block diagram of a PLL system according to a second embodiment of the present invention.

Similarly, please refer to FIG. 9, which is a block diagram of a PLL system 310 according to a second embodiment of the present invention. The PLL system 310 also comprises a first PD 320, a charge pump 330, a loop filter 340, a VCO 350, a phase-controllable frequency divider 360, and a phase-shift detector 370. In addition, the phase-shift detector 370 comprises a second PD 380, a first divider 390, and a second divider 400. The only difference between the first embodiment and this second embodiment is the second divider 400, which divides the wobble signal so that the detection range is capable of being larger than that in the first embodiment.

Figure 10:
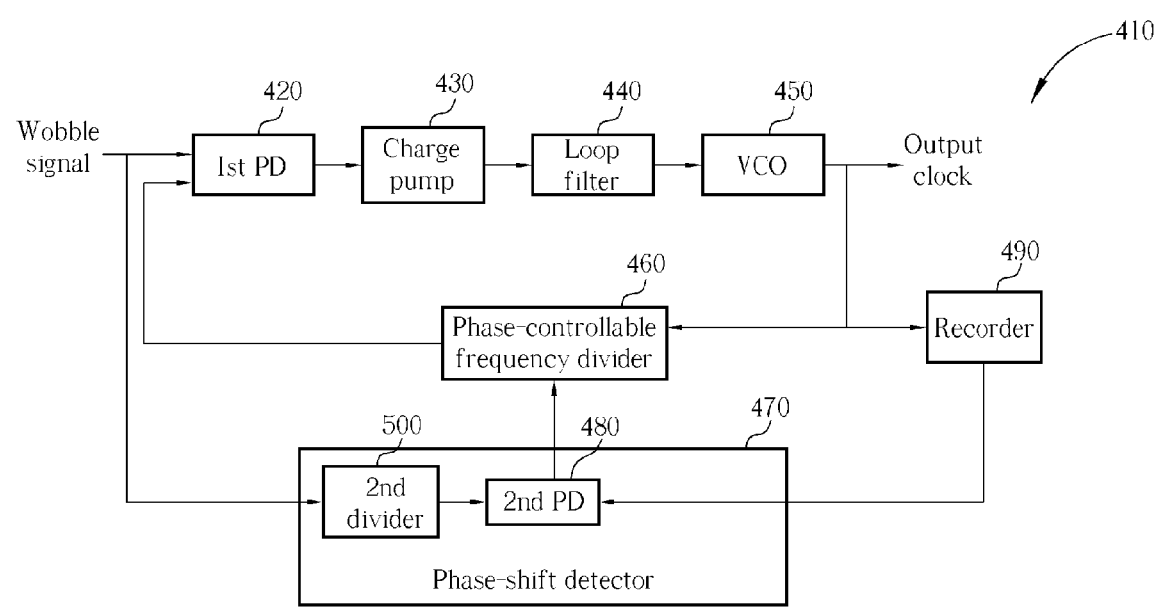
FIG. 10 is a block diagram of a PLL system according to a third embodiment of the present invention.

Please refer to FIG. 10, which is a block diagram of a PLL system 410 according to a third embodiment of the present invention. The PLL system 410 also comprises a first PD 420, a charge pump 430, a loop filter 440, a VCO 450, a phase-controllable frequency divider 460, and a phase-shift detector 470. The phase-shift detector 470 comprises a second PD 480. Here, the output clock is outputted into a recorder 490 as the reference for the recording bit clock. In this embodiment, the recorder 490 outputs a recording sync signal, which is synchronous to the recording data, to the second PD 480 as a reference. As shown in FIG. 10, the second PD 480 generates phase-adjusting signals according to the phase difference between the wobble signal and the recording sync signal from the recorder 490. For example, in the application of DVD+R/RW or DVD-RW, each 1456 recording bits plus 32 bits frame sync for total 1488 recording bits are constructed into a frame. In this case, the recording sync signal can be the frame sync signal that is synchronous to the frame sync of the recording data. In addition, the phase-shift detector 470 can further comprise an optional frequency divider 500 shown in FIG. 10. This optional frequency divider 500 divides the frequency of the wobble signal. Thus, the detection range of the second PD 480 is enlarged.

Figure 11:
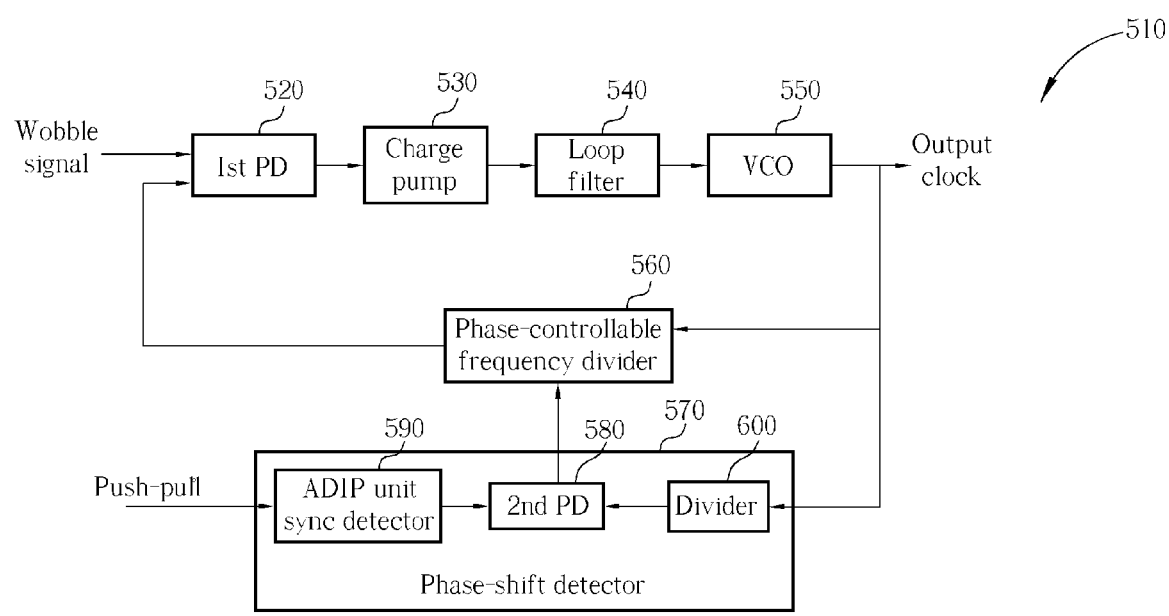
FIG. 11 is a block diagram of a PLL system according to a fourth embodiment of the present invention.

In addition to the wobble signal, the wobble tracks on a recordable optical disk also comprises some address information corresponding to a location on the recordable optical disk, which is called the physical address and is used to find the position where the recording data to be recorded, such as the ADIP (Address-in-Pregroove) information for the DVD+R/RW and the LPP (Land Pre-pits) information for the DVD-R/RW. The information related to the physical address can also be used as the reference for the phase-shift detector. Please refer to FIG. 11, which is a block diagram of a PLL system 510 according to a fourth embodiment of the present invention. This embodiment is quite similar to the first embodiment shown in FIG. 10. However, the phase-shift detector 570 comprises an ADIP unit sync detector 590. Apparently, this embodiment is applied to the application of DVD+R/RW. The ADIP unit sync detector 590 can generate an ADIP unit sync signal used for indicating the phase change of the first wobble within an ADIP unit (8 wobbles). According to the DVD+R/RW specification, the period of one ADIP unit corresponds to 93 wobbles. As shown in FIG. 11, the phase-shift detector 570 uses the ADIP unit sync signal and the divided output clock generated from the frequency divider 600 to generate the phase-adjusting signal.

Figure 12:
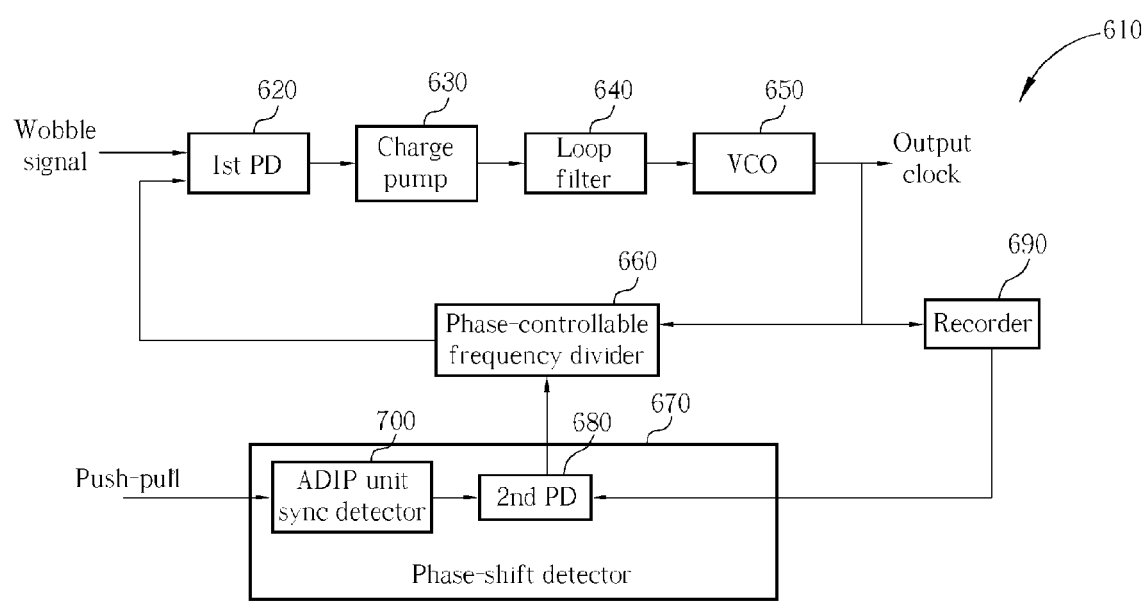
FIG. 12 is a block diagram of a PLL system according to a fifth embodiment of the present invention.

Please refer to FIG. 12, which is a block diagram of a PLL system 610 according to a fifth embodiment of the present invention. This embodiment is similar to the third embodiment shown in FIG. 12. It is the same that the recording sync signal is utilized as a reference of the second PD 680. The difference is to utilize the ADIP unit sync signal as another reference of the second PD 680. Therefore, the phase-shift detector 670 generates the phase-adjusting signal according to the phase difference between the recording sync signal and the ADIP unit sync signal. According to the DVD+R/RW specification, an ideal phase difference between the begin of the odd frame of recording data and the begin of an ADIP unit is defined to be 16 wobbles, and the actual phase difference between them can be obtained by detecting the actual phase difference between the recording sync signal and the ADIP unit sync signal. If the actual phase difference is different from the ideal one, the phase shift imposed upon the output clock can be correctly estimated.

Figure 13:
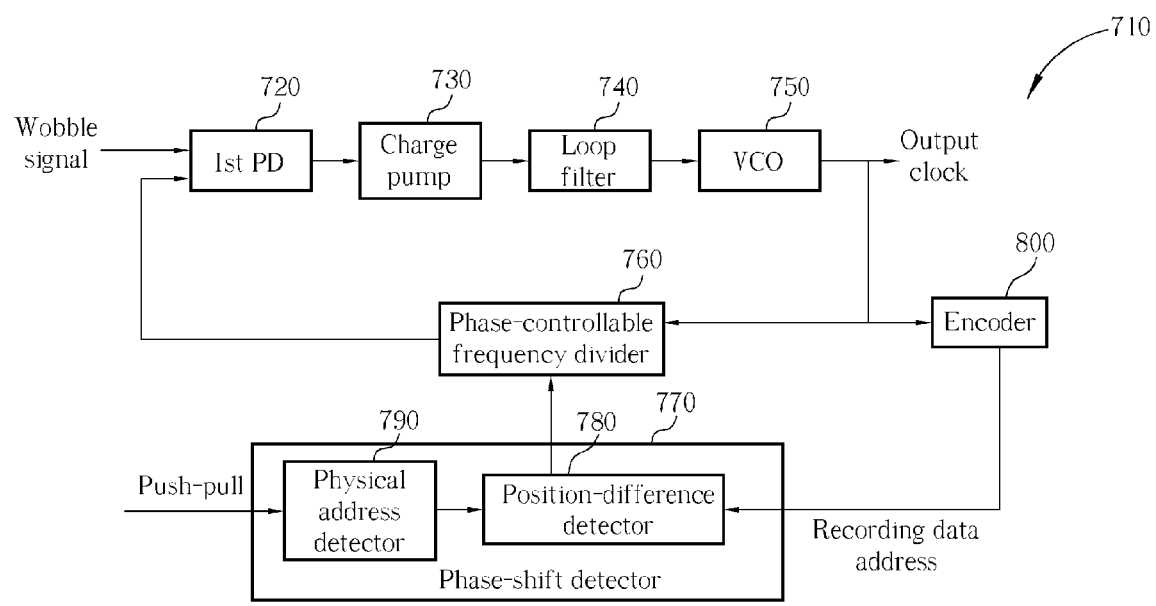
FIG. 13 is a block diagram of a PLL system according to a sixth embodiment of the present invention.
Figure 14:
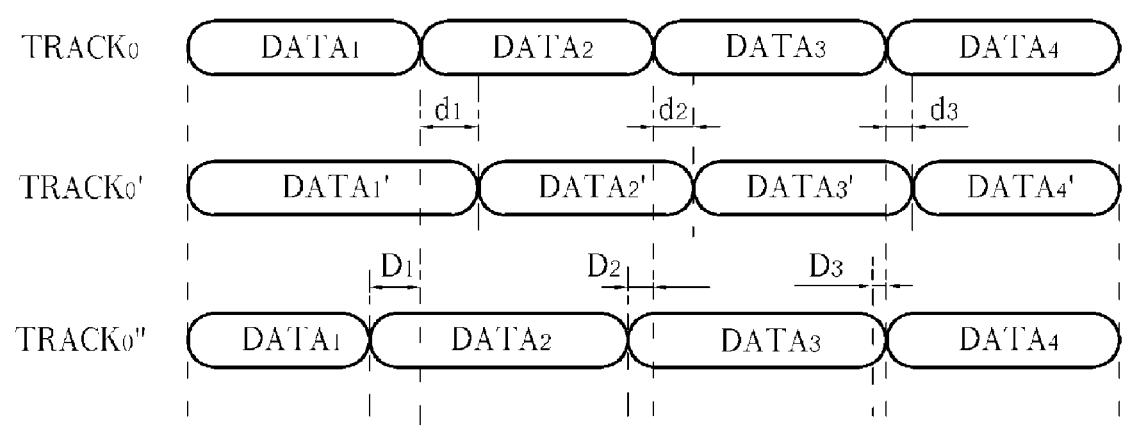
FIG. 14 is a diagram illustrates the operation of the PLL system shown in FIG. 13.

Additionally, in the fourth and fifth embodiments shown in FIGS. 13 and 14, if a larger detection range of the phase shift is required, the ADIP unit sync signal can be replaced by an ADIP word sync signal, which is used to indicate the position of the ADIP word sync. Besides, as mentioned above, the fourth and fifth embodiments are utilized in the application of DVD+R/RW that a DVD+R/RW disk has ADIP information thereon. In the application of DVD-R/RW, it can replace the ADIP unit sync signal with the land pre-pit (LPP) sync signal as a reference of the phase-shift detector.

Figure 1:
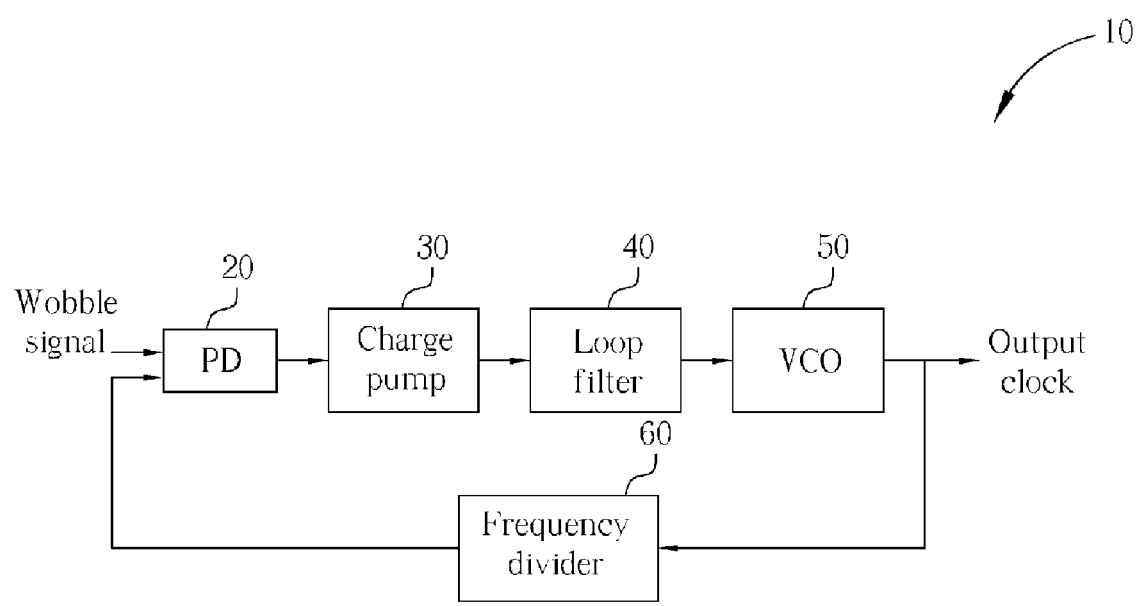
FIG. 1 is a diagram of a related art PLL.
Figure 2:
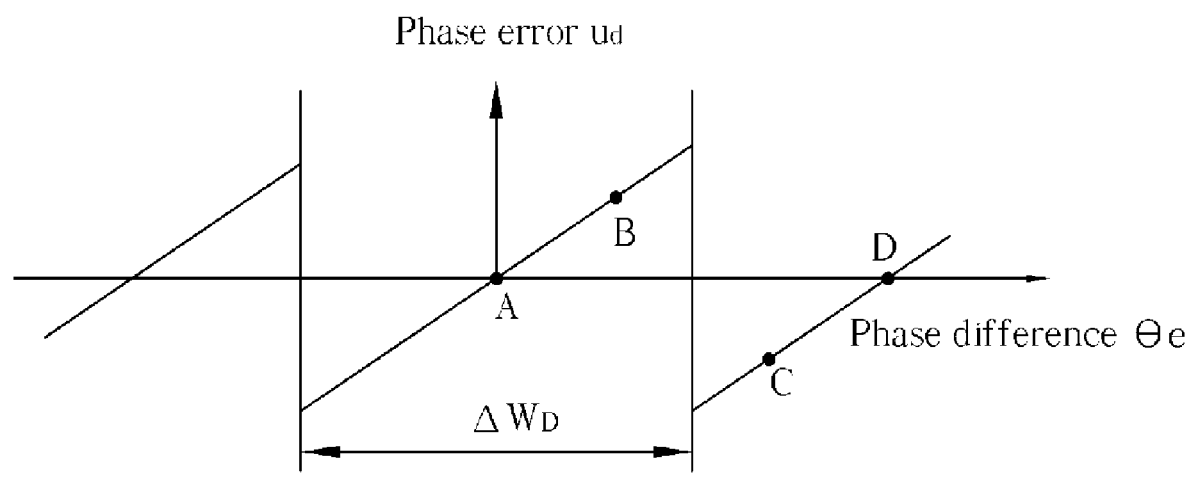
FIG. 2 is a diagram illustrating the phase shift phenomenon in the related art.
Figure 3:
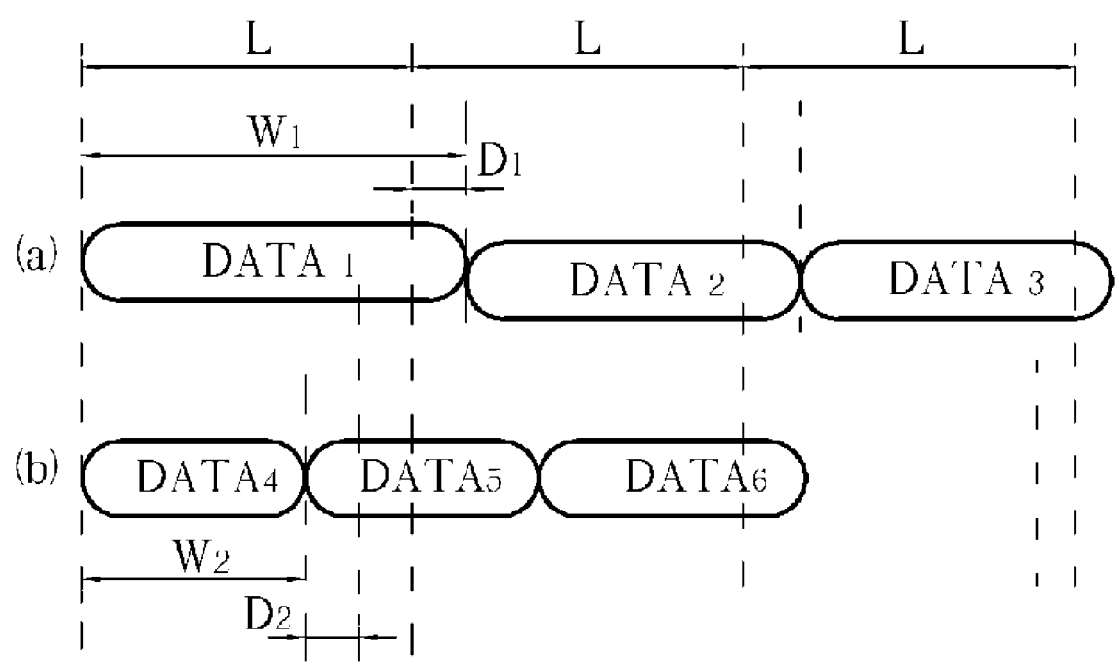
FIG. 3 is a diagram illustrating the problem of the recording offset in the related art.

As mentioned above, the phase-shift detector generates phase-adjusting signals according to the phase difference between two reference signals (for example, a wobble signal and an ADIP unit sync signal). In fact, it can also generate phase-adjusting signals according to the position difference between the ideal position and the actual position of recording data. As shown in FIG. 3, the data length of the recorded data is too long or too short due to the phase shift phenomenon, and it can detect the position deviation estimate the phase shift. Please refer to FIG. 13, which is a block diagram of a PLL system 710 according to a sixth embodiment of the present invention. In this embodiment, the phase-shift detector 770 comprises a position difference detector 780 instead of the phase detector utilized in above-mentioned embodiments. The output clock is inputted into the encoder 800 for driving the encoder 800 for encoding and recording the recording data, in which a recording data address corresponding to the recording data can be provided. When the recording data are being recorded onto a recordable optical disk, the encoder 800 outputs the corresponding recording data address to the position difference detector 780.

In this embodiment, the phase-shift detector 770 further comprises a physical address detector 790 for detecting the physical address on the recordable optical disk (e.g. a DVD+R/RW disk or a DVD-R/RW disk) through a well-known push-pull signal detected from the recordable optical disk. The phase-shift detector 770 generates the phase-adjusting signal according to the position difference between the recording data address and the detected physical address. In this embodiment, the phase-shift detector 770 generates the phase-adjusting signal according to if the difference between the recording data address and the detected physical address is different from an ideal one.

Please refer to FIG. 14, which illustrates the operation of the PLL system 710 shown in FIG. 13. The track $TRACK_0$ shows the ideal positions of a plurality of data blocks $DATA_1$, $DATA_2$, $DATA_3$, $DATA_4$. It is obvious that each of the data blocks $DATA_1$, $DATA_2$, $DATA_3$, $DATA_4$ has an identical data length. Concerning the track $TRACK_0'$, it shows that a data block $DATA_1'$ affected by the phase shift and has a data length longer than the one of the data block $DATA_1$. The position difference detector 780 detects a position difference $d_1$, and outputs a corresponding phase-adjusting signal to the phase-controllable frequency divider 760. Next, the phase-controllable frequency divider 760 adjusts the phase of an outputted frequency-divided signal during recording the data block $DATA_2'$. When the next data block $DATA_2'$ is recorded, the position difference $d_2$ is less than the original position difference $d_1$ due to the operation of phase adjust corresponding to the detected position difference $d_1$. Similarly, after the operation of phase adjust corresponding to the detected position difference $d_2$ during recording the data block $DATA_3'$, the position difference $d_3$ of the data block $DATA_3'$ is less than the previous position difference $d_2$. In the end, the end position of the data block $DATA_4'$ is aligned to a correct position.

Concerning the track $TRACK_0''$, it shows that a data block $DATA_1''$ affected by the related art phase shift. And has a data length shorter than the one of the data block $DATA_1$ The position difference detector 780 detects a position difference $D_1$, and then outputs a corresponding phase-adjusting signal to the phase-controllable frequency divider 760. Next, the phase-controllable frequency divider 760 adjusts the phase of an outputted frequency-divided signal during recording the data block $DATA_2''$. When the next data block $DATA_2''$ is recorded, the position difference $D_2$ is less than the original position difference $D_1$ due to the operation of phase adjust corresponding to the detected position difference $D_1$. Similarly, after the operation of phase adjust corresponding to the detected position difference $D_2$ during recording the data block $DATA_3''$, the position difference $D_3$ of the data block $DATA_3'$ is less than the previous position difference $D_2$. In the end, the end position of the data block $DATA_4''$ is aligned to a correct position.

Figure 15:
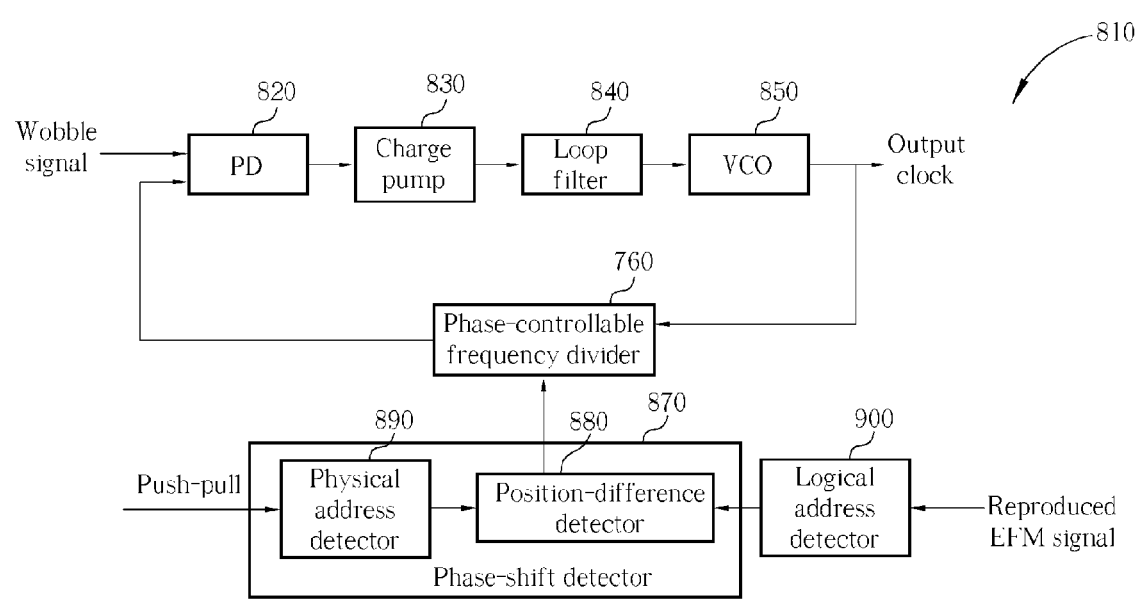
FIG. 15 is a block diagram of a PLL system according to a seventh embodiment of the present invention.

Please refer to FIG. 15, which is a block diagram of a PLL system 810 according to a seventh embodiment of the present invention. This embodiment is similar to the sixth embodiment shown in FIG. 13. The only difference is that the phase-shift detector 870 further comprises a logical address detector 900. The logical address detector 900 receives the reproduced EFM signal read from the recordable optical disk and output the logical address to the position difference detector 880 according to the reproduced EFM signal. Therefore, the position difference detector 880 is capable of detecting a position difference between the physical address detected from the push-pull signal and the detected logical address detected from reproduced EFM signal to generate the phase-adjusting signal. For example, in a DVD-R/RW or DVD+R/RW disk, a data sector is the smallest addressable logical unit of the recorded data, and the begin of each data sector contains a sector sync code and 4 bytes of the identification data (ID) that contains a 3-byte sector number. In this example, the logical address can be comprised of the sector sync code and the sector number of the recorded data sector.

Figure 16:
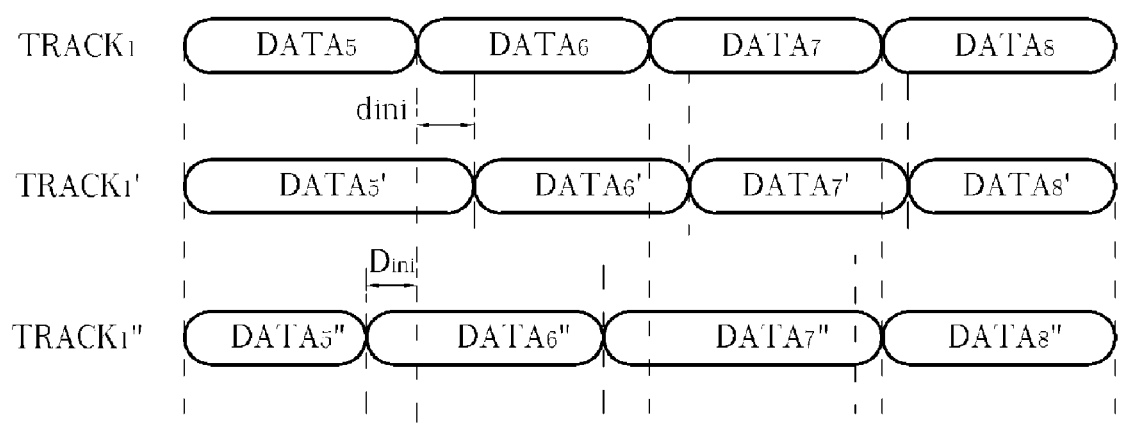
FIG. 16 is a diagram illustrating the operation of the PLL system shown in FIG. 15.

Please refer to FIG. 16, which is a diagram illustrating the operation of the PLL system 810 shown in FIG. 15. Similar to FIG. 16, the track $TRACK_1$ shows the ideal positions of a plurality of data blocks $DATA_5$, $DATA_6$, $DATA_7$, $DATA_8$. It is obvious that each of the data blocks $DATA_5$, $DATA_6$, $DATA_7$, $DATA_8$ has an identical data length.

Concerning a data block $DATA_5'$ having been recorded onto a recordable optical disk during a previous recording operation and having a data length longer than a desired data length defined by the data block $DATA_5$, when the logical address detector 900 receives the reproduced EFM signal generated from the data block $DATA_5'$ recorded on the recordable disk, the logical address detector 900 detects a logical address of the data block $DATA_5'$. In addition, the physical address is detected by the physical address detector 890 through a well-known push-pull signal read from the recordable optical disk. Then, the position difference detector 880 detects an initial position difference $d_{ini}$ of the recorded data block $DATA_5'$ and outputs a phase-adjusting signal to the phase-controllable frequency divider 880 according to the initial position difference $d_{ini}$. Next, the phase-controllable frequency divider 860 adjusts the phase of an outputted frequency-divided signal. In this embodiment, because the reproduced EFM signal is not available after the recording operation starts, the phase-shift detector 870 detects the initial position difference $d_{ini}$ of the recorded data block $DATA_5'$ and memorizes it before the recording operation starts. After the recording operation starts, the phase-shift detector 870 outputs a phase-adjusting signal to the phase-controllable frequency divider 880 according to the memorized initial position difference $d_{ini}$, so that the data lengths of following data blocks are gradually reduced. In the end, the end position of the data block $DATA_8'$ is aligned to a correct position.

Concerning a data block $DATA_5''$ having been recorded onto the recordable optical disk during a previous recording operation and having a data length shorter than a desired data length defined by the data block $DATA_5$, when the logical address detector 900 receives the reproduced EFM signal generated from the data block $DATA_5''$ recorded on the recordable disk, the logical address detector 900 detects a logical address of the data block $DATA_5''$. In addition, the physical address is detected by the physical address detector 890 through a well-known push-pull signal read from the recordable optical disk. Then, the position difference detector 880 detects an initial position difference $D_{ini}$ of the recorded data block $DATA_5''$ and memorizes it before the recording operation starts. After the recording operation starts, the position difference detector 880 outputs a phase-adjusting signal to the phase-controllable frequency divider 880 according to the memorized initial position difference $D_{ini}$, so that the data lengths of following data blocks are gradually increased. In the end, the end position of the data block $DATA_8''$ is aligned to a precise position.

Figure 17:
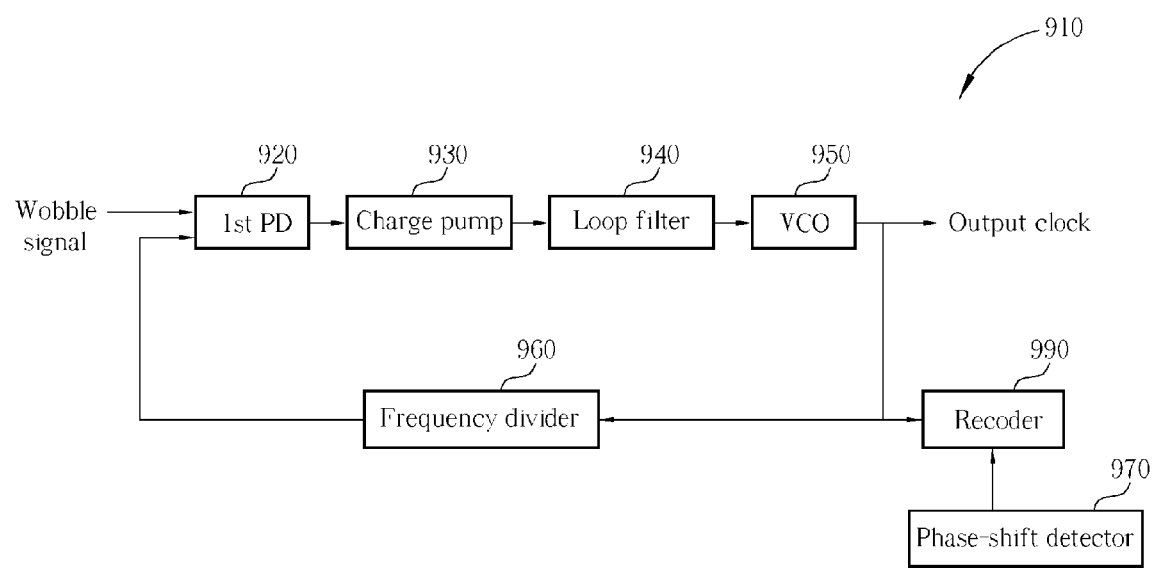
FIG. 17 is a block diagram of another system according to the present invention.
Figure 18:
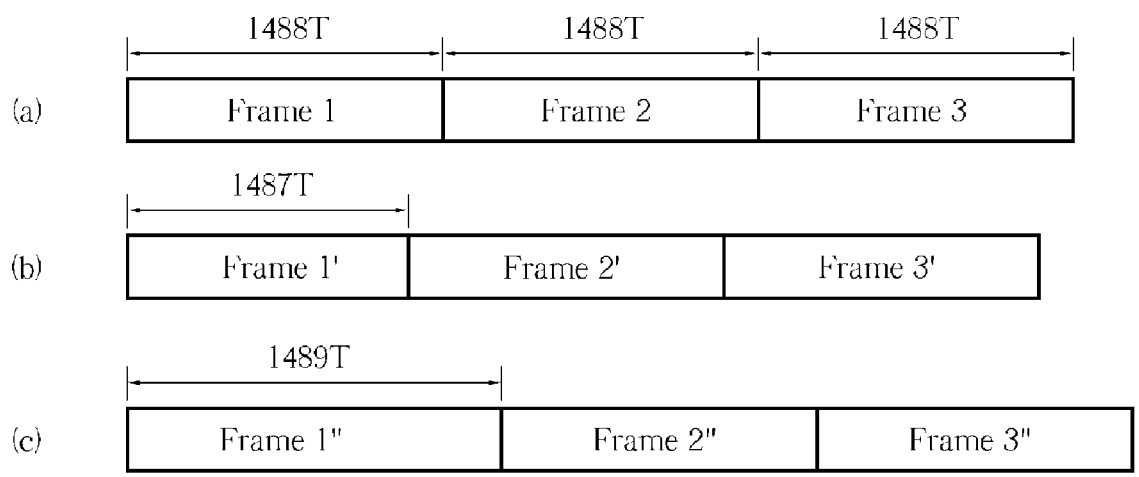
FIG. 18 is a diagram illustrating the operation of the system shown in FIG. 17.

Please refer to FIG. 17, which is a block diagram of another system 910 according to the present invention. The system 910 includes a recorder 990, a phase-shift detector 970, a phase detector (PD) 920, a charge pump 930, a loop filter 940, a voltage-controlled oscillator (VCO) 950, and a frequency divider 960. The function of the PD 920, the charge pump 930, the loop filter 940, the VCO 950,and a frequency divider 960 is the same as that of the those components of the same name in the related art PLL 10, and the function of the phase-shift detector 970 is the same as that of the PLL system 110, so that the lengthy description is omitted here for simplicity. The recorder 990 receives the output clock from the VCO 950 as the reference clock for recording data, and further receives the phase-adjusting signal from the phase-shift detector 970 for inserting or deleting one bit or more of recording data to be recorded. Please refer to FIG. 18 that is a timing diagram illustrating the operations of the recorder 990 in the application of DVD+R/RW or DVD-RW, where a normal frame of recording data contain 1488 recording bits. As shown in FIG. 18(a), if the phase-shift detector 970 is disabled, the length of the frame 1, frame 2, and frame 3 is normal and equal to 1488T. As shown in FIG. 18(b), when the phase-shift detector 970 detects that the phase of the output lock lags the ideal phase, the recorder 990 deletes the last bit of the frame 1' and the deleted bit is discarded to be recorded, which leads the position of the following frame 2' and frame 3'. As shown in FIG. 18(c), when the phase-shift detector 970 detects that the phase of the output lock leads the ideal phase, the recorder 990 inserts one dummy bit at the end of the frame 1" and the inserted dummy bit is recorded, which lags the position of the following frame 2" and frame 3". By deleting or inserting one bit at the end of a frame according to the phase-adjusting signal, the recorder 990 can compensate the phase shift detected by the phase-shift detector 970.

In contrast to the related art, the present invention provides a phase-controllable frequency divider positioned at the feedback path. Therefore, the problem of related art phase shift phenomenon is solved through tuning the phase-controllable frequency divider, and the recording quality is greatly improved. Besides, no matter how large the phase shift is, the claimed invention is capable of making the phase of an output clock locked to a correct phase. In addition to a reference of the recording data, the output clock can also be a reference for controlling the rotation of the recordable optical disk in a CLV (Constant-Linear Velocity) speed.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A phase locked loop (PLL) system for generating an output signal according to a first reference signal, the output signal being used as a reference clock to write recording data on an optical medium, the PLL system comprising:
    a clock generator receiving the first reference signal and a first frequency-divided signal to generate the output signal according to a phase difference between the first reference signal and the first frequency-divided signal;
    a phase-shift detector generating a phase adjusting signal corresponding to a phase difference between the output signal and the first reference signal; and
    a phase-controllable frequency divider connected to the clock generator and the phase-shift detector for dividing the frequency of the output signal by a frequency dividing ratio to generate the first frequency-divided signal and for receiving the phase adjusting signal to adjust the phase of the first frequency-divided signal;
    wherein the phase-controllable frequency divider adjusts the frequency dividing ratio according to the phase adjusting signal.

2. The PLL system of claim 1 wherein the phase-controllable frequency divider comprises a counter for counting the output signal, and the phase-controllable frequency divider generates the first frequency-divided signal according to the count value.

3. The PLL system of claim 2 wherein the phase-controllable frequency divider adjusts the count value according to the phase adjusting signal.

4. The PLL system of claim 1 wherein the first reference signal is a wobble signal generated from the optical medium.

5. The PLL system of claim 4 wherein the phase-shift detector comprises:
    a frequency divider dividing the output signal to generate a second frequency-divided signal; and
    a phase difference detector connected to the frequency divider for detecting a phase difference between the second frequency-divided signal and the wobble signal to generate the phase adjusting signal.

6. The PLL system of claim 4 wherein the phase-shift detector comprises:
    a first frequency divider dividing the output signal to generate a second frequency-divided signal;
    a second frequency divider dividing the wobble signal to generate a third frequency-divided signal; and
    a phase difference detector connected to the first and second frequency dividers for detecting a phase difference between the second frequency-divided signal and the third frequency-divided signal to generate the phase adjusting signal.

7. The PLL system of claim 4 wherein the phase-shift detector detects a phase difference between the wobble signal and a recording synchronization signal synchronous to the recording data for generating the phase adjusting signal.

8. The PLL system of claim 4 wherein the optical medium is a DVD-R/RW disk.

9. The PLL system of claim 4 wherein the optical medium is a DVD+R/RW disk.

10. The PLL system of claim 4 wherein the phase-shift detector comprises:
    a frequency divider dividing the wobble signal to generate a second frequency-divided signal; and
    a phase difference detector connected to the frequency divider for detecting a phase difference between the second frequency-divided signal and a recording synchronization signal synchronous to the recording data to generate the phase adjusting signal.

11. The PLL system of claim 4 wherein the optical medium is a DVD+R/RW disk, and the phase-shift detector comprises:
    an ADIP sync detector generating an ADIP synchronization signal synchronous to the ADIP units of the optical medium;
    a frequency divider for dividing the output signal to generate a second frequency-divided signal; and
    a phase difference detector connected to the frequency divider and the ADIP sync detector for detecting a phase difference between the second frequency-divided signal and the ADIP synchronization signal to generate the phase adjusting signal.

12. The PLL system of claim 4 wherein the optical medium is a DVD+R/RW disk, and the phase-shift detector comprises:
    an ADIP sync detector generating an ADIP synchronization signal synchronous to the ADIP units of the optical medium; and
    a phase difference detector connected to the ADIP sync detector for detecting a phase difference between the ADIP synchronization signal and a recording synchronization signal synchronous to the recording data to generate the phase adjusting signal.

13. The PLL system of claim 4 wherein the optical medium is a DVD-R/RW disk, and the phase-shift detector comprises:
a land-pre-pit (LPP) sync detector detecting LPP bits to generate an LPP synchronization signal;
a frequency divider dividing the output signal to generate a second frequency-divided signal; and
a phase difference detector connected to the frequency divider and the LPP sync detector for detecting a phase difference between the second frequency-divided signal and the LPP synchronization signal to generate the phase adjusting signal.

14. The PLL system of claim 4 wherein the optical medium is a DVD-R/RW disk, and the phase-shift detector comprises:
a land-pre-pit (LPP) sync detector detecting LPP bits to generate an LPP synchronization signal; and
a phase difference detector connected to the LPP sync detector for detecting a phase difference between the LPP synchronization signal and a recording synchronization signal synchronous to the recording data to generate the phase adjusting signal.

15. The PLL system of claim 4 wherein the phase-shift detector comprises:
a physical address detector detecting a physical address on the optical medium; and
a position difference detector for detecting a position difference between the physical address and a logical address of the recording data to generate the phase adjusting signal.

16. The PLL system of claim 4 wherein the phase-shift detector comprises:
a physical address detector detecting a physical address on the optical medium;
a logic address detector detecting a logical address of the recorded data on the optical medium; and
a position difference detector for detecting a position difference between the physical address and the logical address of the recorded data to generate the phase adjusting signal.

17. A method for generating an output signal according to a first reference signal, the output signal being used as a reference clock to write recording data on an optical medium, the method comprising:
receiving the first reference signal and a first frequency-divided signal to generate the output signal according to a phase difference between the first reference signal and the first frequency-divided signal;
generating a phase adjusting signal corresponding to a phase difference between the output signal and the first reference signal;
dividing the frequency of the output signal by a frequency dividing ratio to generate the first frequency-divided signal;
receiving the phase adjusting signal to adjust the phase of the first frequency-divided signal; and
adjusting the frequency dividing ratio recording to the phase adjusting signal.

18. The method of claim 17 further comprising:
counting the output signal to generate a count value, and generating the first frequency-divided signal according to the count value.

19. The method of claim 18 further comprising:
adjusting the count value according to the phase adjusting signal.

20. The method of claim 17 wherein the first reference signal is a wobble signal generated from the optical medium.

21. The method of claim 20 wherein generating the phase adjusting signal comprises:
dividing the output signal to generate a second frequency-divided signal; and
detecting a phase difference between the second frequency-divided signal and the wobble signal to generate the phase adjusting signal.

22. The method of claim 20 wherein generating the phase adjusting signal comprises:
dividing the output signal to generate a second frequency-divided signal;
dividing the wobble signal to generate a third frequency-divided signal; and
detecting a phase difference between the second frequency-divided signal and the third frequency-divided signal to generate the phase adjusting signal.

23. The method of claim 20 wherein generating the phase adjusting signal comprises:
detecting a phase difference between the wobble signal and a recording synchronization signal synchronous to the recording data for generating the phase adjusting signal.

24. The method of claim 20 wherein the optical medium is a DVD-R/RW disk.

25. The method of claim 20 wherein the optical medium is a DVD+R/RW disk.

26. The method of claim 20 wherein generating the phase adjusting signal comprises:
dividing the wobble signal to generate a second frequency-divided signal; and
detecting a phase difference between the second frequency-divided signal and a recording synchronization signal synchronous to the recording data for generating the phase adjusting signal.

27. The method of claim 20 wherein the optical medium is a DVD+R/RW disk, and generating the phase adjusting signal comprises:
generating an ADIP synchronization signal synchronous to the ADIP units of the optical medium;
dividing the output signal to generate a second frequency-divided signal; and
detecting a phase difference between the second frequency-divided signal and the ADIP synchronization signal to generate the phase adjusting signal.

28. The method of claim 20 wherein the optical medium is a DVD+R/RW disk, and generating the phase adjusting signal comprises:
generating an ADIP synchronization signal synchronous to the ADIP units of the optical medium; and
detecting a phase difference between the ADIP synchronization signal and a recording synchronization signal synchronous to the recording data to generate the phase adjusting signal.

29. The method of claim 20 wherein the optical medium is a DVD-R/RW disk, and generating the phase adjusting signal comprises:
detecting LPP bits to generate an LPP synchronization signal;
dividing the output signal to generate a second frequency-divided signal; and
detecting a phase difference between the second frequency-divided signal and the LPP synchronization signal to generate the phase adjusting signal.

30. The method of claim 20 wherein the optical medium is a DVD-R/RW disk, and generating the phase adjusting signal comprises:
detecting LPP bits to generate an LPP synchronization signal; and detecting a phase difference between the LPP synchronization signal and a recording synchronization signal synchronous to the recording data for generating the phase adjusting signal.

31. The method of claim 20 wherein generating the phase adjusting signal comprises:
    detecting a physical address on the optical medium; and
    detecting a position difference between the physical address and a logical address of the recording data to generate the phase adjusting signal.

32. The method of claim 20 wherein generating the phase adjusting signal comprises:
    detecting a physical address on the optical medium;
    detecting a logical address of the recorded data on the optical medium; and
    detecting a position difference between the physical address and a logical address of the recorded data to generate the phase adjusting signal.

* * * * *